(12) United States Patent
Wei et al.

(10) Patent No.: US 9,874,780 B2
(45) Date of Patent: Jan. 23, 2018

(54) LIQUID CRYSTAL DISPLAY DEVICE AND MANUFACTURING METHOD THEREOF

(71) Applicant: Shenzhen China Star Optoelectronics Technology Co., Ltd., Shenzhen (CN)

(72) Inventors: Hongquan Wei, Shenzhen (CN); Yanan Wang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 254 days.

(21) Appl. No.: 14/908,548

(22) PCT Filed: Dec. 28, 2015

(86) PCT No.: PCT/CN2015/099105
§ 371 (c)(1),
(2) Date: Jan. 29, 2016

(87) PCT Pub. No.: WO2017/084175
PCT Pub. Date: May 26, 2017

(65) Prior Publication Data
US 2017/0255045 A1 Sep. 7, 2017

(30) Foreign Application Priority Data
Nov. 18, 2015 (CN) .......................... 2015 1 0797173

(51) Int. Cl.
*G02F 1/1335* (2006.01)
*G02F 1/1337* (2006.01)
*C23C 14/06* (2006.01)

(52) U.S. Cl.
CPC ...... *G02F 1/13362* (2013.01); *C23C 14/0652* (2013.01); *G02F 1/1337* (2013.01);
(Continued)

(58) Field of Classification Search
CPC ............... G02F 1/13362; G02F 1/1337; G02F 1/133528; G02F 1/133617; G02F 1/133603; G02F 2001/133614; C23C 14/0652
(Continued)

(56) References Cited

U.S. PATENT DOCUMENTS

2014/0362556 A1* 12/2014 Cho .......................... B32B 3/30
362/19

FOREIGN PATENT DOCUMENTS

CN 104991374 A 10/2015
WO WO2015144288 A1 10/2015

* cited by examiner

*Primary Examiner* — Nathanel R Briggs
*Assistant Examiner* — William Peterson
(74) *Attorney, Agent, or Firm* — Leong C. Lei (57) ABSTRACT

The present invention provides a liquid crystal display device and a manufacturing method thereof. The liquid crystal display device uses a quantum rod orientation layer (2) to conduct parallel alignment of a quantum rod layer (3) so that the aligned quantum rod layer (3) may replace a conventional lower polarizer. The liquid crystal display device manufacturing method applies an inclined vapor deposition process to form a quantum rod orientation layer (2). The quantum rod orientation layer (2) includes a plurality of grooves (21) that has an extension direction substantially perpendicular to a transmission axis direction of an upper polarizer (7). A quantum rod layer (3) is then formed on the quantum rod orientation layer (2). The quantum rod layer (3) so formed includes a plurality of quantum rods (31) that has a long axis direction substantially parallel to the extension direction of the grooves (21), namely parallel alignment of the quantum rod layer (3). The aligned quantum rod layer (3) may replace a conventional lower polarizer (Continued)

to improve light transmission rate and utilization of backlighting, increasing displaying brightness and reducing manufacturing cost.

11 Claims, 5 Drawing Sheets

(52) U.S. Cl.
CPC .. *G02F 1/133528* (2013.01); *G02F 1/133617* (2013.01); *G02F 2001/133614* (2013.01); *G02F 2202/36* (2013.01)

(58) Field of Classification Search
USPC .......................................................... 349/71
See application file for complete search history.

LIQUID CRYSTAL DISPLAY DEVICE AND MANUFACTURING METHOD THEREOF

BACKGROUND OF THE INVENTION

1. Field of the Invention

The present invention relates to the field of display technology, and in particular to a liquid crystal display device and a manufacturing method thereof.

2. The Related Arts

Liquid crystal displays (LCDs) have various advantages, such as thin device body, low power consumption, and being free of radiation, and have been widely used in for example liquid crystal televisions, mobile phones, personal digital assistants (PDAs), digital cameras, computer monitors, and notebook computer screens, taking a leading position in the flat panel display field.

Most of the LCDs that are currently available in the market are backlighting LCDs, which comprise a liquid crystal display panel and a backlight module. The liquid crystal display panel is not luminous itself and must refract out light from the backlight module to generate an image. A conventional liquid crystal display panel is commonly made up of an array substrate, a color filter substrate laminated to the array substrate, and a liquid crystal layer arranged between the array substrate and the color filter substrate. The array substrate is provided with a lower polarizer attached thereto and the color filter substrate is provided with an upper polarizer attached thereto. The polarizers are optic films that are formed by laminating multiple layers of polymeric materials and have a function for generating polarized light, an effect being to convert natural light having no polarization into polarized light to realize transmission and blocking of optic paths thereby achieving a purpose of displaying.

For liquid crystal display devices that are currently available, theoretically, light transmission of the upper and lower polarizers for backlighting is less than 50%, so that when light passes through structures of a liquid crystal panel, such as electrode layers, the color filter layer, the liquid crystal layer, and glass substrates, the displaying brightness that an observer may actually perceive is less than 10% of the illumination brightness emitting from the backlight source. Transmission rate of light and utilization of the backlight source are extremely low.

Similar to quantum dots (QDs), quantum rods (QRs) are of a size of nanometer scale. Due to quantum confinement of electrons and holes, a continuous energy band structure is changed into a discrete energy level structure exhibiting molecular characteristics and fluorescence is generated when excited. By varying the size of the quantum rod, different ranges of wavelength of light can be excited and generated. The characteristic of the quantum rod that emits polarized light when excited is a very important feature thereof. The quantum rod is a semiconductor material of nanometer scale and has a shape that is a one-dimensional structure. Due to high internal quantum efficiency, light from a backlight source can be greatly converted into polarized light. By adjusting an orienting direction of a long axis of the quantum rod, the polarized light generated by exciting the quantum rod can easily pass through a transmission axis of a polarizer arranged in a liquid crystal panel.

Figure 1:
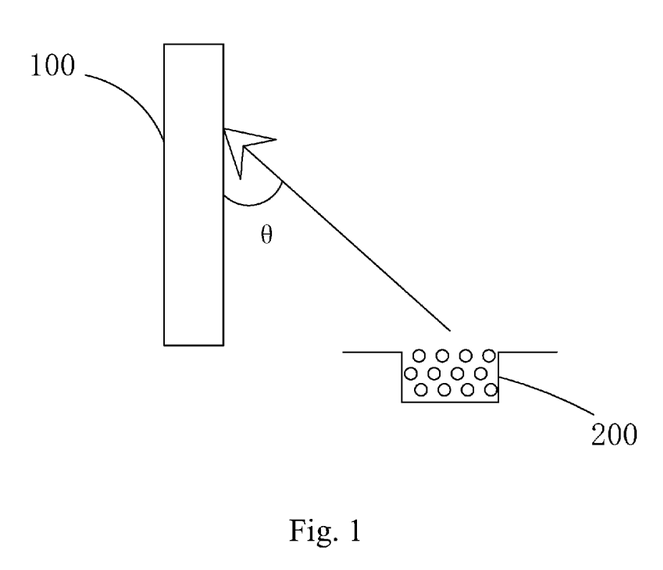
FIG. 1 is a schematic view illustrating the principle of inclined vapor deposition.
Figure 2:
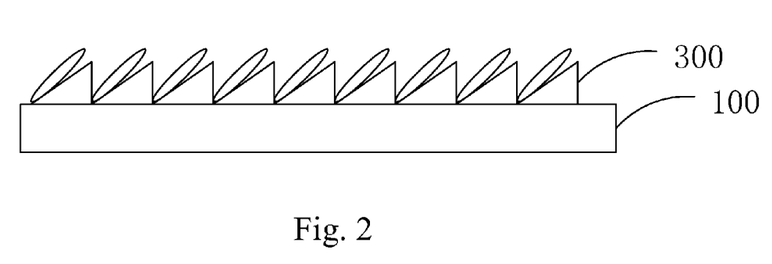
FIG. 2 is a schematic view illustrating orientation films formed through inclined vapor deposition.
Figure 3:
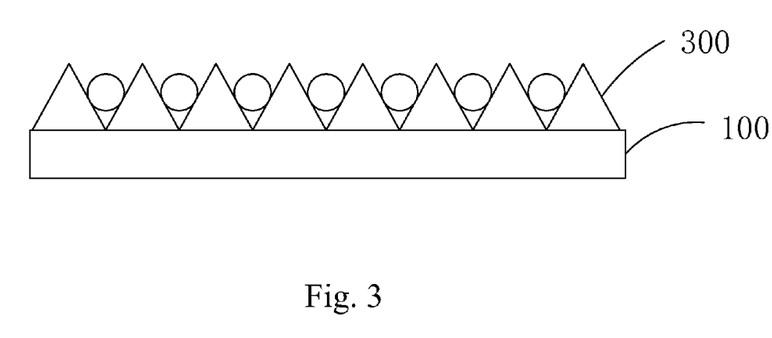
FIG. 3 is a schematic view illustrating orientation films formed through inclined vapor deposition with evaporation angle in the range of 20-45 degrees.

Normal vapor deposition is to arrange an evaporation source to be perpendicular to a surface of a substrate, meaning vapor deposition is conducted in a normal direction of the substrate. Inclined vapor deposition is an operation that performs vapor deposition by arranging an inorganic material, such as silicon nitride (SiOx), in a direction that defines a predetermined angle with respect to a normal direction of a substrate. Referring to FIG. 1, a substrate 100 is positioned vertically and an inorganic evaporation source 200 is arranged at a downward inclined site so that an evaporation beam and a surface of the substrate 100 form therebetween an included angle 8, the included angle being the evaporation angle. Referring to FIG. 2, the inclined vapor deposition allow for formation of multiple orientation films 300 arranged as inclined grooves. By controlling the evaporation angle, the alignment direction achieved with the orientation films so formed. As shown in FIG. 3, when the evaporation angle is in the range of 20-45 degrees, parallel alignment can be achieved.

SUMMARY OF THE INVENTION

An object of the present invention is to provide a liquid crystal display device, which enhances light transmission rate and utilization of backlighting, increasing displaying brightness, and reducing manufacturing cost.

Another object of the present invention is to provide a manufacturing method of a liquid crystal display device, which enhances light transmission rate and utilization of backlighting, increasing displaying brightness, and reducing manufacturing cost.

To achieve the above objects, the present invention provides a liquid crystal display device, which comprises a liquid crystal display panel and a backlight source arranged under the liquid crystal display panel;

the liquid crystal display panel comprising a lower substrate, a quantum rod orientation layer arranged on the lower substrate, a quantum rod layer arranged on the quantum rod orientation layer, an upper substrate arranged opposite to the lower substrate, an upper polarizer arranged on one side of the upper substrate that is distant from the lower substrate, a first liquid crystal alignment layer that is arranged on the quantum rod layer at one side of the lower substrate that is adjacent to the upper substrate, a second liquid crystal alignment layer that is arranged on the upper substrate at one side adjacent to the lower substrate, and a liquid crystal layer interposed between the first liquid crystal alignment layer and the second liquid crystal alignment layer;

the quantum rod orientation layer comprising a plurality of nanometer scale grooves that is arranged parallel to each other and have an extension direction substantially perpendicular to a transmission axis direction of the upper polarizer;

the quantum rod layer comprising a plurality of quantum rods, the plurality of quantum rods each having a long axis direction that is substantially parallel to the extension direction of the grooves.

The quantum rod orientation layer is formed through an inclined vapor deposition process with a material being silicon nitride.

The inclined vapor deposition process is conducted at an evaporation angle of 20 to 45 degrees.

The backlight source comprises an ultraviolet backlight source;

the plurality of quantum rods being arranged according to different sizes to respectively generate, through excitation, red polarization light, green polarization light, and blue polarization light.

The backlight source comprises a blue backlight source;

the plurality of quantum rods being arranged according to different sizes to respectively generate, through excitation, red polarization light and green polarization light.

The present invention also provides a liquid crystal display device manufacturing method, which comprises the following steps:

(1) providing a lower substrate and forming a quantum rod orientation layer on a surface of the lower substrate with an inclined vapor deposition process such that the quantum rod orientation layer comprises a plurality of parallel grooves formed therein;

(2) coating a quantum rod solution on the quantum rod orientation layer to form a quantum rod layer such that the quantum rod layer comprises a plurality of quantum rods, the plurality of quantum rods being caused by the quantum rod orientation layer to achieve parallel alignment so that a long axis direction of each of the plurality of quantum rods is substantially parallel to an extension direction of the grooves;

(3) forming a first liquid crystal alignment layer on the quantum rod layer;

(4) providing an upper substrate and forming a second liquid crystal alignment layer on one side of the upper substrate;

(5) combining the lower and upper substrates together to have the first liquid crystal alignment layer and the second liquid crystal alignment layer opposing each other and filling liquid crystal between the first liquid crystal alignment layer and the second liquid crystal alignment layer to form a liquid crystal layer;

(6) attaching an upper polarizer to one side of the upper substrate that is distant from the lower substrate, wherein the upper polarizer has a transmission axis direction that is substantially perpendicular to the extension direction of the grooves, so as to form a liquid crystal display panel; and (7) arranging a backlight source under the liquid crystal display panel to form a liquid crystal display device.

In step (1), the inclined vapor deposition process is conducted at an evaporation angle of 20 to 45 degrees, the quantum rod orientation layer being formed of a material comprising silicon nitride.

In step (2), the quantum rods are coated with a trioctylphosphine oxide solvent, the quantum rods that are coated with the trioctylphosphine oxide solvent are uniformly dispersed in toluene solvent to form the quantum rod solution.

In step (2), the plurality of quantum rods is arranged according to different sizes to respectively generate, through excitation, red polarization light, green polarization light, and blue polarization light; and in step (7), the backlight source comprises an ultraviolet backlight source.

In step (2), the plurality of quantum rods is arranged according to different sizes to respectively generate, through excitation, red polarization light and green polarization light; and in step (7), the backlight source comprises a blue backlight source.

The present invention further provides a liquid crystal display device, which comprises a liquid crystal display panel and a backlight source arranged under the liquid crystal display panel;

the liquid crystal display panel comprising a lower substrate, a quantum rod orientation layer arranged on the lower substrate, a quantum rod layer arranged on the quantum rod orientation layer, an upper substrate arranged opposite to the lower substrate, an upper polarizer arranged on one side of the upper substrate that is distant from the lower substrate, a first liquid crystal alignment layer that is arranged on the quantum rod layer at one side of the lower substrate that is adjacent to the upper substrate, a second liquid crystal alignment layer that is arranged on the upper substrate at one side adjacent to the lower substrate, and a liquid crystal layer interposed between the first liquid crystal alignment layer and the second liquid crystal alignment layer;

the quantum rod orientation layer comprising a plurality of nanometer scale grooves that is arranged parallel to each other and have an extension direction substantially perpendicular to a transmission axis direction of the upper polarizer;

the quantum rod layer comprising a plurality of quantum rods, the plurality of quantum rods each having a long axis direction that is substantially parallel to the extension direction of the grooves;

wherein the quantum rod orientation layer is formed through an inclined vapor deposition process with a material being silicon nitride;

wherein the inclined vapor deposition process is conducted at an evaporation angle of 20 to 45 degrees; and wherein the backlight source comprises an ultraviolet backlight source;

the plurality of quantum rods being arranged according to different sizes to respectively generate, through excitation, red polarization light, green polarization light, and blue polarization light.

The efficacy of the present invention is that the present invention provides a liquid crystal display device, which uses the arrangement of a quantum rod orientation layer to conduct parallel alignment of a quantum rod layer so that the aligned quantum rod layer may replace a conventional lower polarizer to thereby improve light transmission rate and utilization of backlighting, increasing displaying brightness and reducing manufacturing cost. The present invention provides a liquid crystal display device manufacturing method, which applies an inclined vapor deposition process at a large angle to form a quantum rod orientation layer. The quantum rod orientation layer comprises a plurality of parallel grooves that has an extension direction substantially perpendicular to a transmission axis direction of an upper polarizer and a space crowd-out effect is used in the formation of a quantum rod layer on the quantum rod orientation layer so that a long axis direction of a plurality of quantum rods contained in the quantum rod layer is substantially parallel to the extension direction of the grooves, namely parallel alignment of the quantum rod layer. The aligned quantum rod layer can replace a conventional lower polarizer to improve light transmission rate and utilization of backlighting, increasing displaying brightness and reducing manufacturing cost.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 4:
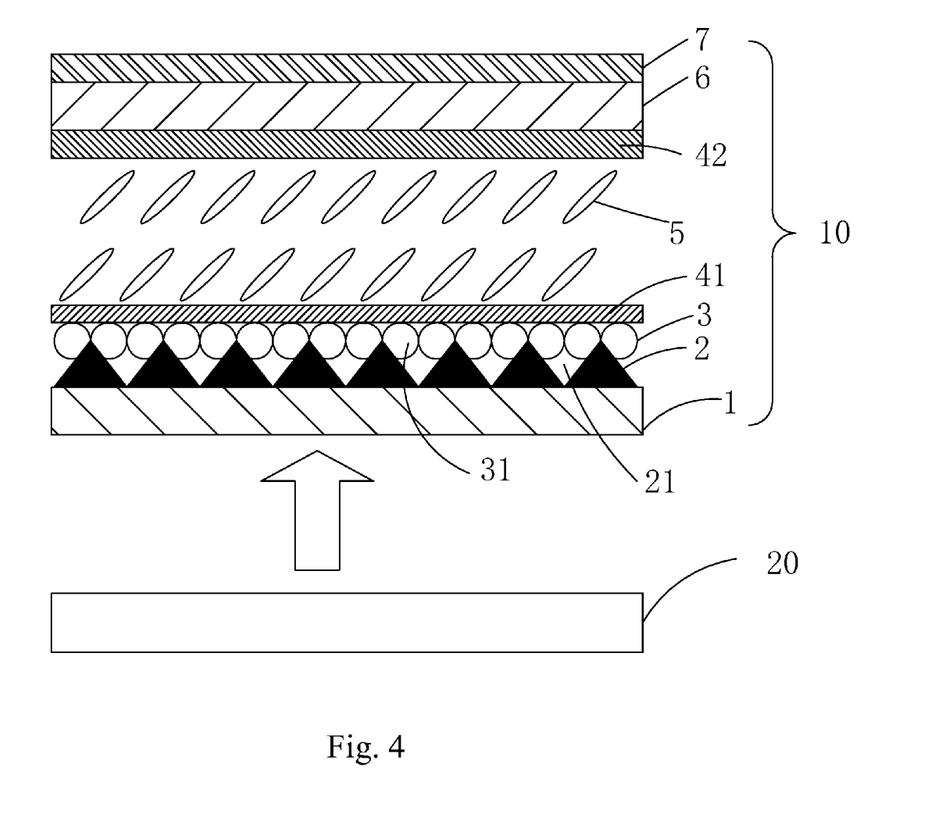
FIG. 4 is a schematic view illustrating the structure of a liquid crystal display device according to the present invention.
Figure 5:
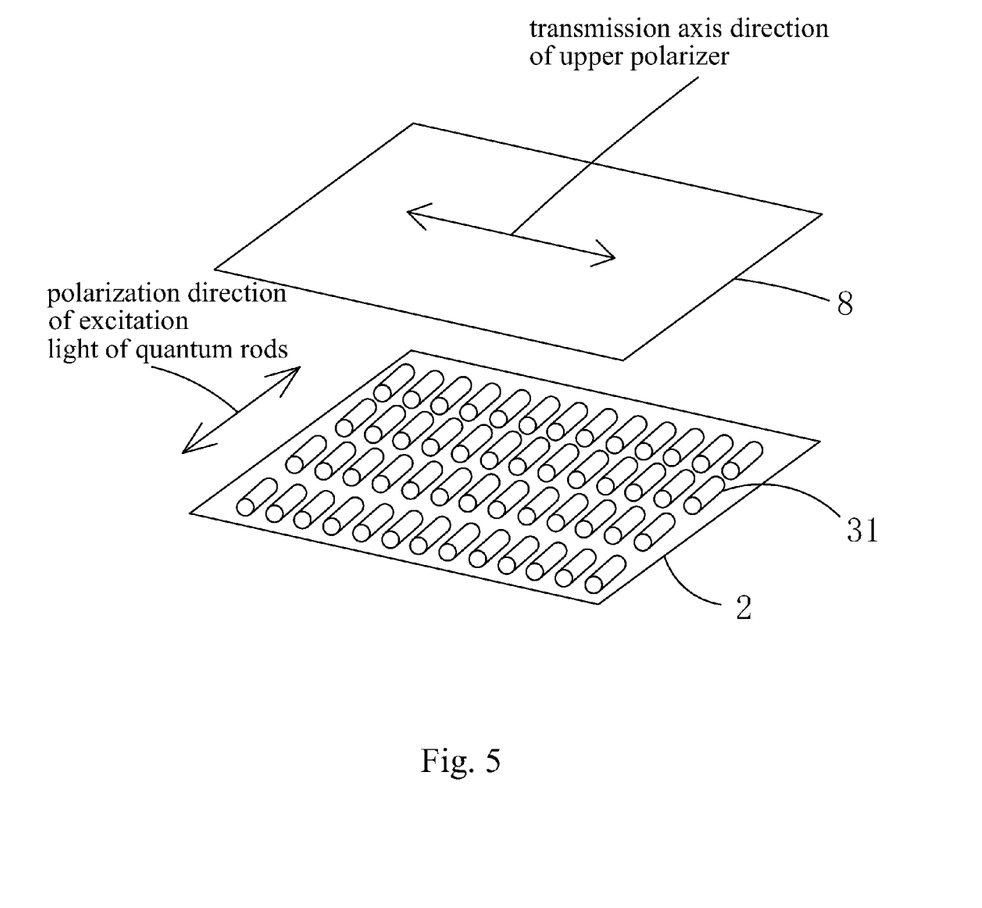
FIG. 5 is a schematic view illustrating polarization directions of an optic path of the liquid crystal display device according to the present invention.

Referring collectively to FIGS. 4 and 5, firstly, the present invention provides a liquid crystal display device, which comprises a liquid crystal display panel 10 and a backlight source 20 arranged under the liquid crystal display panel 10.

The liquid crystal display panel 10 comprises a lower substrate 1, a quantum rod orientation layer 2 arranged on the lower substrate 1, a quantum rod layer 3 arranged on the quantum rod orientation layer 2, an upper substrate 6 arranged opposite to the lower substrate 1, an upper polarizer 7 arranged on one side of the upper substrate 6 that is distant from the lower substrate 1, a first liquid crystal alignment layer 41 that is arranged on the quantum rod layer 3 at one side of the lower substrate 1 that is adjacent to the upper substrate 6, a second liquid crystal alignment layer 42 that is arranged on the upper substrate 6 at one side adjacent to the lower substrate 1, and a liquid crystal layer 5 interposed between the first liquid crystal alignment layer 41 and the second liquid crystal alignment layer 42. The quantum rod orientation layer 2 comprises a plurality of nanometer scale grooves 21 that is arranged parallel to each other and have an extension direction substantially perpendicular to a transmission axis direction of the upper polarizer 7.

The quantum rod layer 3 comprises a plurality of quantum rods 21, and the plurality of quantum rods 21 each has a long axis direction that is substantially parallel to the extension direction of the grooves 21. In other words, the quantum rod layer 3 is caused by the quantum rod orientation layer 2 to achieve parallel alignment.

Specifically, one of the lower substrate 1 and the upper substrate 6 is an array substrate and the other is a color filter substrate. Specific structures of the array substrate and the color filter substrate are known and no further description will be given herein.

The first liquid crystal alignment layer 41 and the second liquid crystal alignment layer 42 are generally formed of materials comprising polyimide (PI).

The quantum rod orientation layer 2 is formed through an inclined vapor deposition process with a material being silicon nitride. The inclined vapor deposition process is conducted at an evaporation angle of 20 to 45 degrees. The quantum rod orientation layer 2 formed with such an evaporation angle may achieve parallel alignment.

The backlight source 20 can be selected as an ultraviolet backlight source. The plurality of quantum rods 31 are provided to match the ultraviolet backlight source through distribution made according to different sizes in order to generate, through excitation, red polarization light, green polarization light, and blue polarization light.

The backlight source 20 may alternatively be selected as a blue backlight source. The plurality of quantum rods 31 are provided to match the blue backlight source through distribution made according to different sizes in order to generate, through excitation, red polarization light and green polarization light.

Referring to a combination of FIGS. 4 and 5, the backlight source 20 supplies light to irradiate the quantum rod layer 3 and excite the plurality of quantum rods 31 to generate polarization light having a polarization direction that is consistent with the long axis directions of the quantum rods 31. The long axis directions of the quantum rods 31 are generally parallel to the extension direction of the grooves 21 and the extension direction of the grooves 21 is substantially perpendicular to the transmission axis direction of the upper polarizer 7. In other words, the polarization direction of the polarization light generated by the excitation of the plurality of quantum rods 31 is perpendicular to the transmission axis direction of the upper polarizer 7 so that the quantum rod layer 3 so aligned can replace a conventional lower polarizer in such a way that the aligned quantum rod layer 3 may generate, through excitation, polarization light having consistent polarization direction to thereby improve light transmission rate and utilization of backlighting, increasing displaying brightness, saving the lower polarizer, and reducing manufacturing cost.

Figure 6:
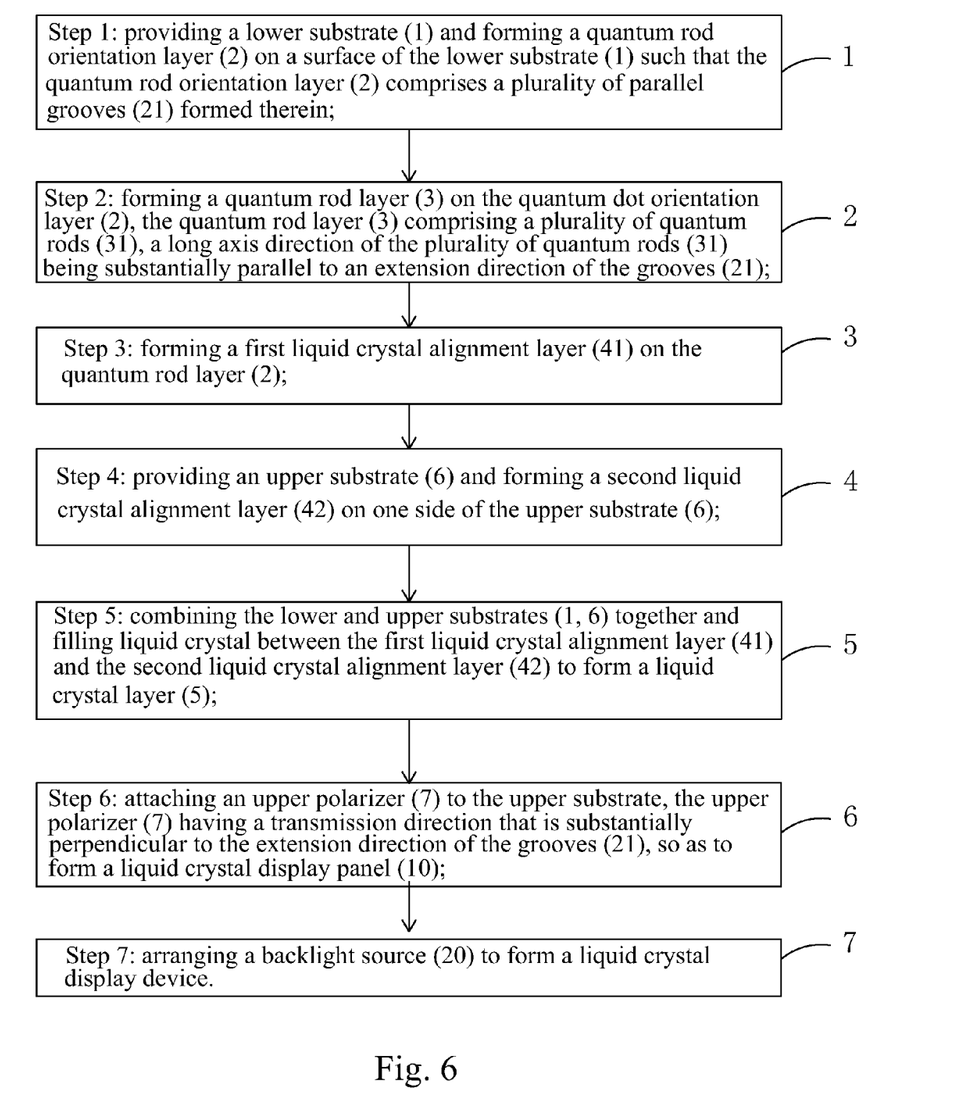
FIG. 6 is a flow chart illustrating a manufacturing method of the liquid crystal display device according to the present invention.

Referring to FIG. 6, in combination with FIGS. 4 and 5, the present invention also provides a liquid crystal display device manufacturing method, which comprises the following steps:

Step 1: providing a lower substrate 1 and forming a quantum rod orientation layer 2 on a surface of the lower substrate 1 with an inclined vapor deposition process such that the quantum rod orientation layer 2 comprises a plurality of parallel grooves 21 formed therein.

Specifically, the quantum rod orientation layer 2 is formed of a material comprising silicon nitride, and the plurality of parallel grooves 21 is nanometer scale grooves having consistent spacing distance therebetween.

The inclined vapor deposition process is conducted at an evaporation angle of 20 to 45 degrees. The quantum rod orientation layer 2 formed with such an evaporation angle may achieve parallel alignment.

Step 2: coating a quantum rod solution on the quantum rod orientation layer 2 to form a quantum rod layer 3 such that the quantum rod layer 3 comprises a plurality of quantum rods 31, the plurality of quantum rods 31 being caused by the quantum rod orientation layer 2 to achieve parallel alignment so that a long axis direction of each of the plurality of quantum rods 31 is substantially parallel to an extension direction of the grooves 21.

Specifically, in Step 2, a trioctylphosphine oxide (TOPO) solvent is first coated on quantum rods and the quantum rods that are coated with the trioctylphosphine oxide solvent are uniformly dispersed in toluene solvent to form a quantum rod solution; the quantum rod solution is then coated on the quantum rod orientation layer 2, wherein due to a space crowd-out effect, the quantum rods 31 are aligned in a condition of lowest energy, namely the long axes of the quantum rods 31 are aligned orderly and parallel in the extension direction of the grooves 21; and finally, the toluene solvent is allowed to completely volatize in room temperature to thereby form the quantum rod layer 3.

Step 3: forming a first liquid crystal alignment layer 41 on the quantum rod layer 2.

Specifically, the first liquid crystal alignment layer 41 is commonly formed of a material comprising PI.

Step 4: providing an upper substrate 6 and forming a second liquid crystal alignment layer 42 on one side of the upper substrate 6.

Specifically, one of the upper substrate 6 of Step 4 and the lower substrate 1 of Step 1 is an array substrate and the other is a color filter substrate. Specific structures of the array substrate and the color filter substrate are known and no further description will be given herein.

The second liquid crystal alignment layer 42 is commonly formed of a material comprising PI.

Step 5: combining the lower and upper substrates 1, 6 together to have the first liquid crystal alignment layer 41 and the second liquid crystal alignment layer 42 opposing each other and filling liquid crystal between the first liquid crystal alignment layer 41 and the second liquid crystal alignment layer 42 to form a liquid crystal layer 5.

Step 6: attaching an upper polarizer 7 to one side of the upper substrate 6 that is distant from the lower substrate 1, wherein the upper polarizer 7 has a transmission axis direction that is substantially perpendicular to the extension direction of the grooves 21, so as to form a liquid crystal display panel 10.

Step 7: arranging a backlight source 20 under the liquid crystal display panel 10 to form a liquid crystal display device.

Specifically, the backlight source 20 can be selected as an ultraviolet backlight source and thus, the plurality of quantum rods 31 of the quantum rod layer 3 formed in Step 2 are provided to match the ultraviolet backlight source through distribution made according to different sizes in order to generate, through excitation, red polarization light, green polarization light, and blue polarization light.

The backlight source 20 may alternatively be selected as a blue backlight source, and thus, the plurality of quantum rods 31 of the quantum rod layer 3 formed in Step 2 are provided to match the blue backlight source through distribution made according to different sizes in order to generate, through excitation, red polarization light and green polarization light.

For the liquid crystal display device manufactured with the above-described method, referring to a combination of FIGS. 4 and 5, the backlight source 20 supplies light to irradiate the quantum rod layer 3 and excite the plurality of quantum rods 31 to generate polarization light having a polarization direction that is consistent with the long axis directions of the quantum rods 31. The long axis directions of the quantum rods 31 are generally parallel to the extension direction of the grooves 21 and the extension direction of the grooves 21 is substantially perpendicular to the transmission axis direction of the upper polarizer 7. In other words, the polarization direction of the polarization light generated by the excitation of the plurality of quantum rods 31 is perpendicular to the transmission axis direction of the upper polarizer 7 so that the quantum rod layer 3 so aligned can replace a conventional lower polarizer in such a way that the aligned quantum rod layer 3 may generate, through excitation, polarization light having consistent polarization direction to thereby improve light transmission rate and utilization of backlighting, increasing displaying brightness, saving the lower polarizer, and reducing manufacturing cost.

In summary, the present invention provides a liquid crystal display device, which uses the arrangement of a quantum rod orientation layer to conduct parallel alignment of a quantum rod layer so that the aligned quantum rod layer may replace a conventional lower polarizer to thereby improve light transmission rate and utilization of backlighting, increasing displaying brightness and reducing manufacturing cost. The present invention provides a liquid crystal display device manufacturing method, which applies an inclined vapor deposition process at a large angle to form a quantum rod orientation layer. The quantum rod orientation layer comprises a plurality of parallel grooves that has an extension direction substantially perpendicular to a transmission axis direction of an upper polarizer and a space crowd-out effect is used in the formation of a quantum rod layer on the quantum rod orientation layer so that a long axis direction of a plurality of quantum rods contained in the quantum rod layer is substantially parallel to the extension direction of the grooves, namely parallel alignment of the quantum rod layer. The aligned quantum rod layer can replace a conventional lower polarizer to improve light transmission rate and utilization of backlighting, increasing displaying brightness and reducing manufacturing cost.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A liquid crystal display device, comprising a liquid crystal display panel and a backlight source arranged under the liquid crystal display panel;
   the liquid crystal display panel comprising a lower substrate, a quantum rod orientation layer arranged on the lower substrate, a quantum rod layer arranged on the quantum rod orientation layer, an upper substrate arranged opposite to the lower substrate, an upper polarizer arranged on one side of the upper substrate that is distant from the lower substrate, a first liquid crystal alignment layer that is arranged on the quantum rod layer at one side of the lower substrate that is adjacent to the upper substrate, a second liquid crystal alignment layer that is arranged on the upper substrate at one side adjacent to the lower substrate, and a liquid crystal layer interposed between the first liquid crystal alignment layer and the second liquid crystal alignment layer;
   the quantum rod orientation layer comprising a plurality of nanometer scale grooves that is arranged parallel to each other and have an extension direction substantially perpendicular to a transmission axis direction of the upper polarizer;
   the quantum rod layer comprising a plurality of quantum rods, the plurality of quantum rods each having a long axis direction that is substantially parallel to the extension direction of the grooves.

2. The liquid crystal display device as claimed in claim 1, wherein the quantum rod orientation layer is formed through an inclined vapor deposition process with a material being silicon nitride.

3. The liquid crystal display device as claimed in claim 2, wherein the inclined vapor deposition process is conducted at an evaporation angle of 20 to 45 degrees.

4. The liquid crystal display device as claimed in claim 1, wherein the backlight source comprises an ultraviolet backlight source;
   the plurality of quantum rods being arranged according to different sizes to respectively generate, through excitation, red polarization light, green polarization light, and blue polarization light.

5. The liquid crystal display device as claimed in claim 1, wherein the backlight source comprises a blue backlight source;
   the plurality of quantum rods being arranged according to different sizes to respectively generate, through excitation, red polarization light and green polarization light.

6. A liquid crystal display device manufacturing method, comprising the following steps:
   (1) providing a lower substrate and forming a quantum rod orientation layer on a surface of the lower substrate with an inclined vapor deposition process such that the quantum rod orientation layer comprises a plurality of parallel grooves formed therein;
(2) coating a quantum rod solution on the quantum rod orientation layer to form a quantum rod layer such that the quantum rod layer comprises a plurality of quantum rods, the plurality of quantum rods being caused by the quantum rod orientation layer to achieve parallel alignment so that a long axis direction of each of the plurality of quantum rods is substantially parallel to an extension direction of the grooves;
(3) forming a first liquid crystal alignment layer on the quantum rod layer;
(4) providing an upper substrate and forming a second liquid crystal alignment layer on one side of the upper substrate;
(5) combining the lower and upper substrates together to have the first liquid crystal alignment layer and the second liquid crystal alignment layer opposing each other and filling liquid crystal between the first liquid crystal alignment layer and the second liquid crystal alignment layer to form a liquid crystal layer;
(6) attaching an upper polarizer to one side of the upper substrate that is distant from the lower substrate, wherein the upper polarizer has a transmission axis direction that is substantially perpendicular to the extension direction of the grooves, so as to form a liquid crystal display panel; and
(7) arranging a backlight source under the liquid crystal display panel to form a liquid crystal display device.

7. The liquid crystal display device manufacturing method as claimed in claim 6, wherein in step (1), the inclined vapor deposition process is conducted at an evaporation angle of 20 to 45 degrees, the quantum rod orientation layer being formed of a material comprising silicon nitride.

8. The liquid crystal display device manufacturing method as claimed in claim 6, wherein in step (2), the quantum rods are coated with a trioctylphosphine oxide solvent, the quantum rods that are coated with the trioctylphosphine oxide solvent are uniformly dispersed in toluene solvent to form the quantum rod solution.

9. The liquid crystal display device manufacturing method as claimed in claim 6, wherein in step (2), the plurality of quantum rods is arranged according to different sizes to respectively generate, through excitation, red polarization light, green polarization light, and blue polarization light; and in step (7), the backlight source comprises an ultraviolet backlight source.

10. The liquid crystal display device manufacturing method as claimed in claim 6, wherein in step (2), the plurality of quantum rods is arranged according to different sizes to respectively generate, through excitation, red polarization light and green polarization light; and in step (7), the backlight source comprises a blue backlight source.

11. A liquid crystal display device, comprising a liquid crystal display panel and a backlight source arranged under the liquid crystal display panel;
the liquid crystal display panel comprising a lower substrate, a quantum rod orientation layer arranged on the lower substrate, a quantum rod layer arranged on the quantum rod orientation layer, an upper substrate arranged opposite to the lower substrate, an upper polarizer arranged on one side of the upper substrate that is distant from the lower substrate, a first liquid crystal alignment layer that is arranged on the quantum rod layer at one side of the lower substrate that is adjacent to the upper substrate, a second liquid crystal alignment layer that is arranged on the upper substrate at one side adjacent to the lower substrate, and a liquid crystal layer interposed between the first liquid crystal alignment layer and the second liquid crystal alignment layer;
the quantum rod orientation layer comprising a plurality of nanometer scale grooves that is arranged parallel to each other and have an extension direction substantially perpendicular to a transmission axis direction of the upper polarizer;
the quantum rod layer comprising a plurality of quantum rods, the plurality of quantum rods each having a long axis direction that is substantially parallel to the extension direction of the grooves;
wherein the quantum rod orientation layer is formed through an inclined vapor deposition process with a material being silicon nitride;
wherein the inclined vapor deposition process is conducted at an evaporation angle of 20 to 45 degrees; and
wherein the backlight source comprises an ultraviolet backlight source;
the plurality of quantum rods being arranged according to different sizes to respectively generate, through excitation, red polarization light, green polarization light, and blue polarization light.

* * * * *